US010321557B2

(12) United States Patent
Brigham

(10) Patent No.: US 10,321,557 B2
(45) Date of Patent: Jun. 11, 2019

(54) PRINTED CIRCUIT BOARD ASSEMBLY WITH AIR DIELECTRIC

(71) Applicant: Massachusetts Institute Of Technology, Cambridge, MA (US)

(72) Inventor: Glenn A. Brigham, Chelmsford, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 84 days.

(21) Appl. No.: 15/302,645

(22) PCT Filed: Apr. 9, 2015

(86) PCT No.: PCT/US2015/025122
§ 371 (c)(1),
(2) Date: Oct. 7, 2016

(87) PCT Pub. No.: WO2015/160624
PCT Pub. Date: Oct. 22, 2015

(65) Prior Publication Data
US 2017/0034904 A1    Feb. 2, 2017

Related U.S. Application Data

(60) Provisional application No. 61/980,653, filed on Apr. 17, 2014.

(51) Int. Cl.
*H01K 3/10* (2006.01)
*H05K 1/02* (2006.01)
(Continued)

(52) U.S. Cl.
CPC ....... *H05K 1/0236* (2013.01); *H01Q 15/0006* (2013.01); *H05K 1/115* (2013.01);
(Continued)

(58) Field of Classification Search
CPC .... H01L 23/49827; H05K 3/42; H05K 1/115; Y10T 29/49165; Y10T 29/49149; Y10T 29/49222
(Continued)

(56) References Cited

U.S. PATENT DOCUMENTS 5,434,751 A    7/1995 Cole et al.
6,046,659 A *  4/2000 Loo ........................ B81B 3/0072
                                          200/181
(Continued)

OTHER PUBLICATIONS

International Search Report and Written Opinion dated Jul. 9, 2015 in corresponding PCT application No. PCT/US2015/025122.
(Continued)

*Primary Examiner* — Thiem D Phan
(74) *Attorney, Agent, or Firm* — Nields, Lemack & Frame, LLC

(57) ABSTRACT

An assembly that includes a printed circuit board having an air gap, and a method of fabricating the assembly is disclosed. The assembly includes at least one air gap. This air gap is created by using a soluble material during the PCB assembly process. The soluble material can preferably be processed in accordance with traditional PCB fabrication processes. For example, other materials can be bonded to the soluble material. Additionally, the soluble material is capable of withstanding a drilling process. After the PCB assembly is complete, the soluble material is then dissolved, leaving an air gap where the soluble material once existed. This assembly may be useful in configurations where an antenna, EBG material or other electronic structure is to be disposed above the top surface of the printed circuit board.

16 Claims, 7 Drawing Sheets

(51) Int. Cl.
*H01Q 15/00* (2006.01)
*H05K 3/46* (2006.01)
*H05K 1/11* (2006.01)
*H05K 1/18* (2006.01)
*H05K 3/40* (2006.01)
*H05K 1/16* (2006.01)
*H01Q 15/14* (2006.01)

(52) U.S. Cl.
CPC ........... *H05K 1/181* (2013.01); *H05K 3/4038* (2013.01); *H05K 3/4697* (2013.01); *H01Q 15/141* (2013.01); *H05K 1/165* (2013.01); *H05K 2201/10098* (2013.01); *H05K 2203/308* (2013.01); *Y10T 29/49165* (2015.01)

(58) Field of Classification Search
USPC .......................... 29/852, 825, 829, 830, 874
See application file for complete search history.

(56) References Cited

U.S. PATENT DOCUMENTS

| | | |
|---|---|---|
| 6,429,509 B1 * | 8/2002 | Hsuan .................. H01L 23/481 257/621 |
| 2003/0151480 A1 | 8/2003 | Orr |
| 2004/0170825 A1 | 9/2004 | Chung |
| 2007/0124930 A1 | 6/2007 | Cheng et al. |
| 2012/0206301 A1 | 8/2012 | Flores-Cuadras et al. |

OTHER PUBLICATIONS

International Preliminary Report on Patentability dated Oct. 18, 2016 in corresponding PCT application No. PCT/US2015/025122.

* cited by examiner

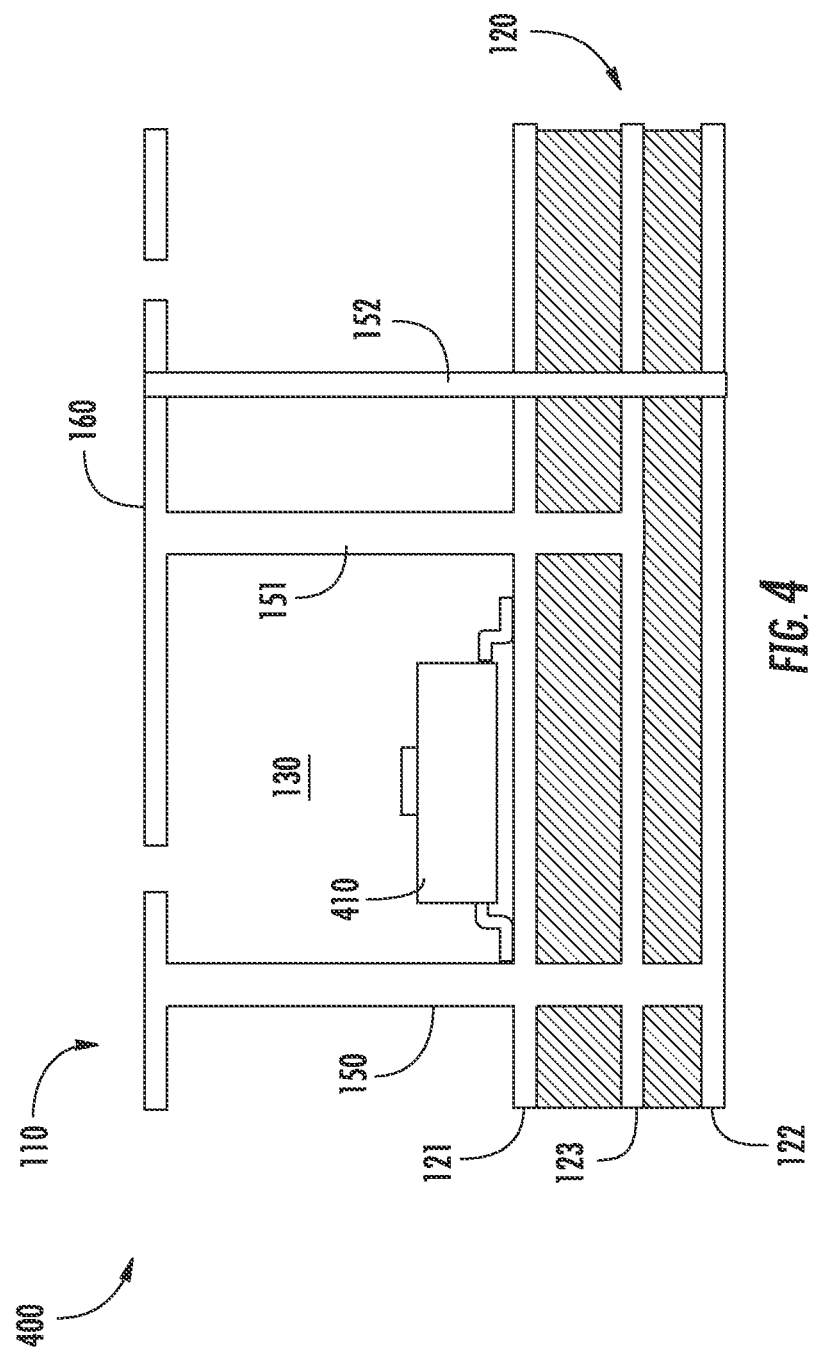

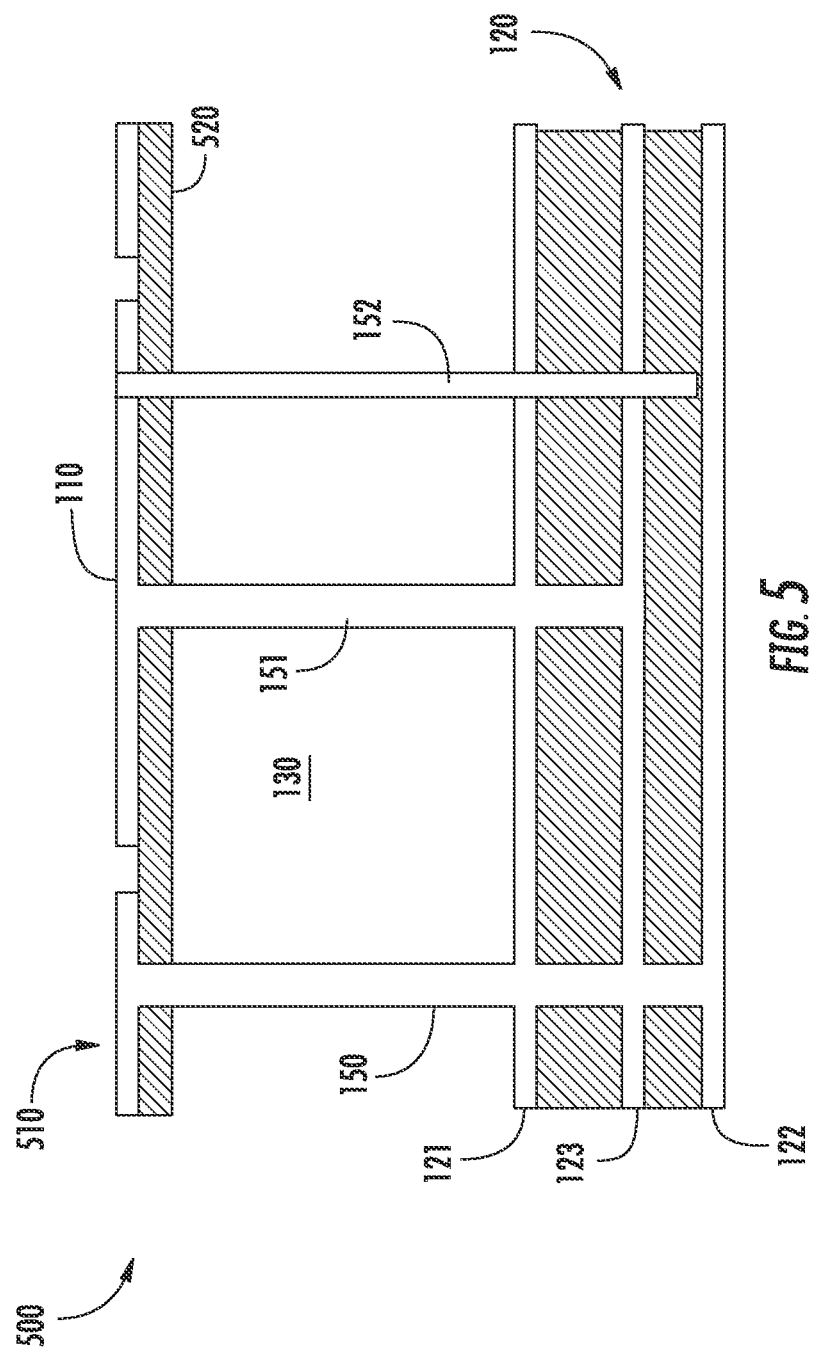

PRINTED CIRCUIT BOARD ASSEMBLY WITH AIR DIELECTRIC

This application claims priority to U.S. Provisional Application Ser. No. 61/980,653, filed Apr. 17, 2014, the disclosure of which is incorporated herein by reference in its entirety.

This invention was made with Government support under Contract No. FA8721-05-C-0002, awarded by the U.S. Air Force. The Government has certain rights in the invention.

BACKGROUND

Printed circuit boards are used ubiquitously for a wide range of applications. A typical printed circuit board (or PCB) has a top and bottom surface, on which components may be affixed, such as by soldering. Between the top and bottom surfaces are a plurality of layers used to carry signals from one point on the PCB to another point. Each layer is comprised of an insulating material with conductive material disposed thereon.

Signals that begin on one layer can move to another layer through the use of vias. Vias are conductive pathways that connect signals on various layers together. If the layers of the PCB are defined as being horizontal planes, these vias are typically vertical conductive pathways. In some embodiments, the vias pass through the entirety of the PCB. In other embodiments, known as blind vias, the via is accessible on either the top or bottom surface, but does not pass through the entirety of the PCB. In another embodiment, known as buried vias, the via may connect signals on two interior layers and not be accessible on either outer surface.

In some embodiments, it may be beneficial to incorporate an antenna into the printed circuit board. However, the insulating material typically used for PCBs has very different properties than air. Most antennas are calibrated and tested with respect to air. Furthermore, higher efficiency and greater antenna operating performance may be achieved if the antenna is spaced apart from the PCB by a layer of air, rather than a different material. Therefore, it may be difficult to develop an antenna that is incorporated into a PCB that has the desired characteristics.

Therefore, it may be desirable for the antenna to be spaced apart from the PCB. However, such a configuration presents challenges regarding mechanically supporting the antenna, and providing electrical connections to the antenna. Therefore, it would be beneficial if there were a process to create a PCB with an attached antenna, where the antenna is spaced apart from the PCB itself. Further, it would be beneficial if the antenna could be attached as part of a standard PCB fabrication process.

SUMMARY

An assembly that includes a printed circuit board having an air gap, and a method of fabricating the assembly is disclosed. The assembly includes at least one air gap. This air gap is created by using a soluble material during the PCB assembly process. The soluble material may be a sheet or a block. The soluble material can preferably be processed in accordance with traditional PCB fabrication processes. For example, other materials can be bonded to the soluble material. Additionally, the soluble material is capable of withstanding a drilling and plating process. After the PCB assembly is complete, the soluble material is then dissolved, leaving an air gap where the soluble material once existed. This assembly may be useful in configurations where an antenna, an EBG material or other electronic structure is to be disposed above the top surface of the printed circuit board.

In one embodiment, a method of method of manufacturing an assembly is disclosed. The method comprises processing a bottom sublaminate; disposing a soluble material on a top surface of the bottom sublaminate; disposing a metal layer on a top surface of the soluble material; drilling a hole through the metal layer, the soluble material and the bottom sublaminate; plating the hole with a conductive material to create a via electrically connecting the metal layer to a signal in the bottom sublaminate; and dissolving the soluble material after the via is created, so that the bottom sublaminate is separated from the metal layer by an air gap. In certain embodiments, mechanical supports are created by drilling a second hole through the metal layer, the soluble material and the bottom sublaminate; and filling the second hole with a non-conductive material to form a mechanical support between the metal layer and the bottom sublaminate. In certain embodiments, a component is mounted on the top surface of the bottom sublaminate prior to disposing the soluble material on the bottom sublaminate. In certain embodiments, a second metal layer is created above the metal layer, having a second via connecting the second metal layer to a second signal in the bottom sublaminate.

In another embodiment, an assembly is disclosed. The assembly comprises a bottom sublaminate; a metal layer disposed above and separated from the bottom sublaminate by an air gap; and a via electrically connecting a first signal trace on the bottom sublaminate to the metal layer and supporting the metal layer.

BRIEF DESCRIPTION OF THE DRAWINGS

For a better understanding of the present disclosure, reference is made to the accompanying drawings, which are incorporated herein by reference and in which:

FIG. 4 shows a cross-sectional view of a second embodiment; and

FIG. 5 shows a cross-sectional view of a third embodiment.

DETAILED DESCRIPTION OF THE INVENTION

This disclosure relates to the use of soluble materials. In certain embodiments, these soluble materials may be made soluble by a variety of solvents. For example, the soluble material may be water soluble, such as POLYOX resin from Dow Chemical and polyvinyl alcohols, such as PVOH, PVA or PVAI. Water soluble resins are thermoplastic materials that are readily calendared, extruded, injection molded, or cast. Alternatively, the soluble material may be soluble in the presence of a different solvent. The soluble material may dissolve in the presence of heat. Thus, any soluble material which can be made to dissolve, by whatever means, may be employed. In certain embodiments, the soluble material may dissolve when exposed to heat. In other embodiments, the soluble material may dissolve when exposed to certain frequencies. Therefore, the disclosure is not limited to a particular embodiment.

Figure 1:
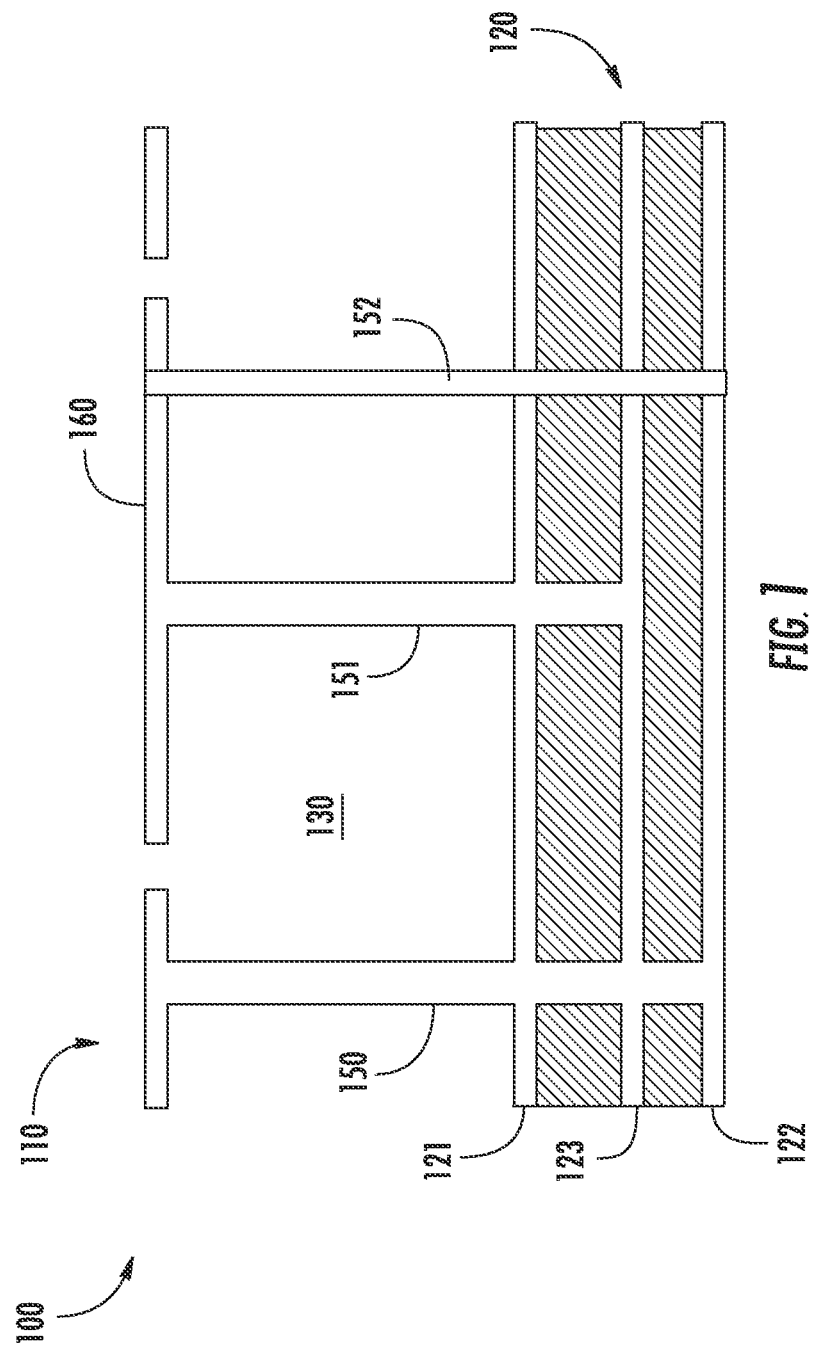
FIG. 1 shows a cross-sectional view of a first embodiment.

FIG. 1 shows a cross-sectional view of an assembly according to a first embodiment. In this embodiment, the assembly 100 includes a metal layer 110, a bottom sublaminate 120 and an air gap 130 disposed therebetween. Because of the air gap 130, the metal layer 110 is disposed above and spaced apart from the bottom sublaminate 120.

The metal layer 110 may be a single layer of conductive material, such as copper. On the metal layer 110, an antenna 160 may be created. The antenna 160 may be a metal conductive layer that can be in any desired shape or thickness. The antenna may be planar, meaning that it is disposed on the metal layer 110. In other embodiments, the antenna may not be planar. For example, the antenna may be formed on the metal layer 110 and have a vertical component. Thus, in certain embodiments, the antenna may have substantially a two dimensional shape, where it is planar on the surface of the metal layer 110. In other embodiments, the antenna 160 may have a three dimensional structure, such that it extends vertically from the metal layer 110. In other embodiments, a signal trace may be disposed on the metal layer 110. This signal trace may be a test point or serve some other function.

The bottom sublaminate 120 may be a printed circuit board, fabricated using traditional techniques. The bottom sublaminate 120 may have an arbitrary number of signal, power and ground layers, as the present disclosure does not limit the type or complexity of the bottom sublaminate 120. The bottom sublaminate 120 may comprises a plurality of distinct layers stacked on top of one another, such as a top surface 121 (which faces the air gap 130), zero or more interior layers and a bottom surface 122. These various layers may have different functions. For example, some layers may be signal layers. Conductive traces are disposed on signal layers to route signals across the bottom sublaminate 120. Some layers may be ground layers, which as the name suggests, are conductive layers which are electrically connected to ground. Other layers may be power layers, which are conductive layers that are electrically connected to one or more voltage sources. The disclosure is not limited to any particular number of layers in the bottom sublaminate 120. In fact, any number of signal and ground layers may be included in the bottom sublaminate 120. In some embodiments, one or more power layers may also be included in the bottom sublaminate 120. In certain embodiments, the top surface 121 of the bottom sublaminate 120 may be a first signal layer, while the bottom surface 122 may be a second signal layer. Again, any number of layers may be disposed between the top surface 121 and bottom surface 122. For example, the interior layers may also comprise one or more signal layers. In certain embodiments, one or more of the interior layers may be ground layers.

The various layers of the bottom sublaminate 120 may be separated by different materials. For example, the top surface 121 and an adjacent interior layer 123 may be separated by a laminate material, suitable for high frequency signals. One such material may be RO4350®, available from Rogers Corporation. The thickness of this laminate material may be about 10 mils, although other thicknesses are within the scope of the disclosure. The material used may be designed for RF applications and have a specific dielectric constant and loss tangent. Many materials having suitable performance may be used. In one embodiment, a particular material is used due to its performance, cost and its dielectric constant.

Ground and power layers are typically comprised of copper, such as 0.5 ounce copper. Other copper thicknesses may be used, based on acceptable electrical and mechanical performance. The interior layers may be separated by a dielectric material. In some embodiments, RF signals are not carried on one or more of the interior layers. In these embodiments, the RF signals on the top and bottom surfaces may not be coupled to or influenced by this dielectric material used in the interior layers. In these embodiments, a low cost material, such as FR4, which is commonly used for PCBs, may be used to separate the interior layers. However, other materials may also be used to separate the interior layers. For example, in one embodiment, RO4350® may be used to separate the interior layers as well. This dielectric material may be about 50 mils thick, although other thicknesses are also within the scope of the disclosure.

Many different laminate material types may be used to separate the various layers of the bottom sublaminate 120. In some embodiments, the laminate material may be the same as the dielectric material for material uniformity. However, in other embodiments, different materials may be used, based on the electrical and mechanical performance requirements, cost, and availability. For example, the material used between adjacent layers that do not carry high frequency signals may be lower cost filler materials, as described above.

Thus, the bottom sublaminate 120 may comprise a top surface 121, a bottom surface 122, and zero or more interior layers 123 disposed between the top surface 121 and the bottom surface 122. The bottom sublaminate 120 may comprise any desired number of signal layers, and may also comprise any desired number of ground and power layers.

In some embodiments, the top surface 121 and the bottom surface 122 may be ground layers, and interior layer 123 may be a signal layer. However, the configuration of the bottom sublaminate 120 is not limited by this disclosure.

Disposed between the metal layer 110 and the bottom sublaminate 120 is an air gap 130. As described in more detail below, the air gap is created when a soluble material, which is used during the assembly process, is dissolved.

The thickness of the air gap 130 may be selected based on the various criteria. For example, in some embodiments, the thickness of the air gap 130 may be a fixed thickness, such as 250 mil. Of course, other criteria may also be used.

There are two types of connections that may exist between the metal layer 110 and the bottom sublaminate 120. The first type is an electrical connection. As the term suggests, this type of connection is used to electrically connect the metal layer 110, or a portion of the metal layer 110, to a signal, power or ground in the bottom sublaminate 120. This type of connection may also provide mechanical support to the metal layer 110.

The second type of connection is a mechanical connection. This type of connection is simply used to support the metal layer 110 and is not used to make an electrical connection. This type of connection is a mechanical support. In certain embodiments, a non-conductive material is used as the mechanical support. However, in other embodiments, the mechanical support may be made with a metal via, which is not electrically connected to the bottom sublaminate 120.

FIG. 1 shows both types of connection. Via 150 is an electrical connection, and is used to electrically connect a signal trace from the bottom surface 122 of the bottom sublaminate 120 to the metal layer 110. This signal may be a signal, or may be power or ground. Via 150 may also serve to mechanically support the metal layer 110. Via 151 is also an electrical connection, and is used to electrically connect a signal trace from an interior layer 123 of the bottom sublaminate 120 to the metal layer 110. This signal may be a signal, or may be power or ground. Via 151 may also serve to mechanically support the metal layer 110.

Vias 150, 151 may comprise a metal material, such as copper or another conductive material. The width of the vias 150, 151 is not limited by this disclosure. For example, to provide adequate mechanical support, the vias 150, 151 may be thicker than would customarily be used in a PCB. Further, vias, as that term is used herein, provide an electrical connection between a signal in the bottom sublaminate 120 and the metal layer 110. As stated above, the signal in the bottom sublaminate 120 may be a signal trace, such as a high frequency RF trace, a power signal or a ground signal.

Mechanical support 152 is a mechanical connection, used to mechanically hold the metal layer 110. FIG. 1 shows the mechanical support 152 extending to the bottom surface 122 of the bottom sublaminate 120 in order to provide maximum mechanical support. In other embodiments, the mechanical support 152 may not extend all of the way through bottom sublaminate 120. The mechanical support 152 may be constructed of a non-conductive or dielectric material, such as Taiyo UVHP-100 or a suitable material. As noted above, the mechanical support 152, may, in certain embodiments, be constructed from a conductive material. Mechanical supports 152 differ from vias in that mechanical supports do not electrically connect a signal from the bottom sublaminate 120 to the metal layer 110.

Figure 2:
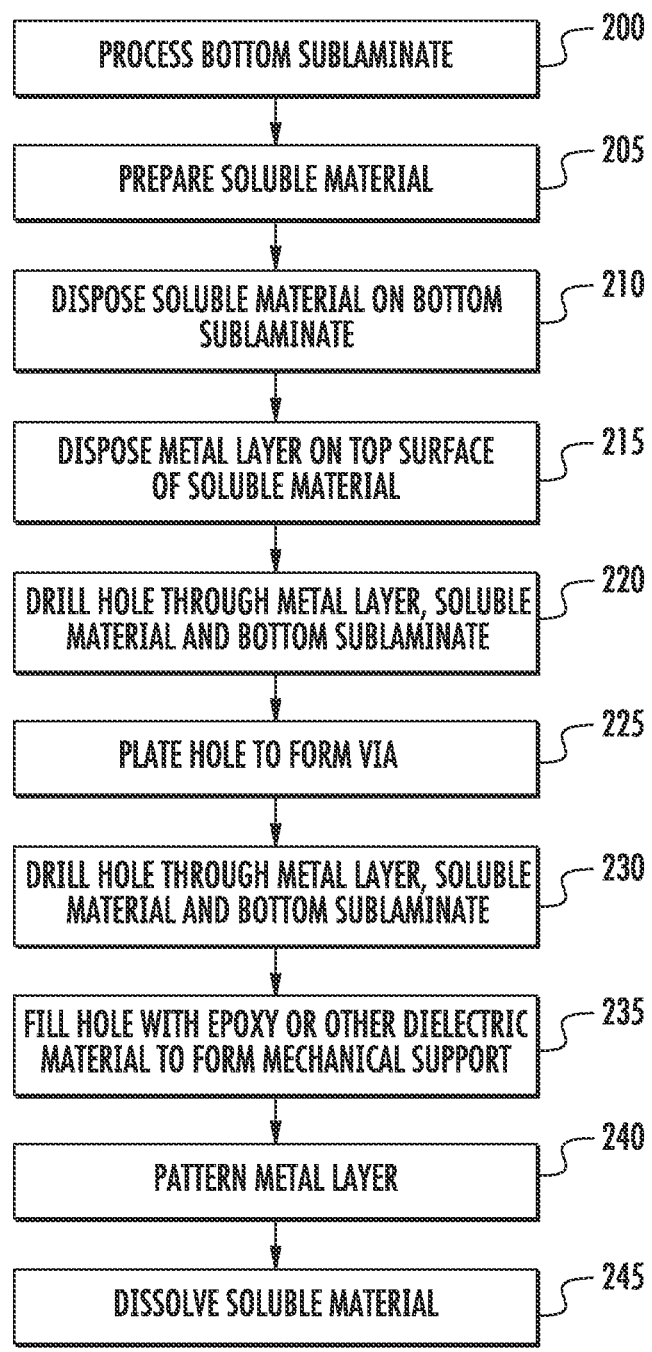
FIG. 2 is a flowchart showing a representative fabrication process used to manufacture the assembly shown in FIG. 1.

FIG. 2 shows a process that may be used to fabricate the assembly 100 shown in FIG. 1.

First, as shown in process 200, the bottom sublaminate 120 is processed. The bottom sublaminate 120 may comprise any desired number of layers, where one or more of these layers may be signal layers. Additionally, one or more power and/or ground layers may also be included in the bottom sublaminate 120. The bottom sublaminate 120 may be fabricated using traditional manufacturing techniques. In certain embodiments, the top surface 121 of the bottom sublaminate 120 may be a ground layer.

In process 205, the soluble material is prepared. The soluble material may be planarized to the desired thickness. In other embodiments, soluble material may be machined to a shape other than flat.

The soluble material is then attached to the bottom sublaminate, as shown in process 210. In certain embodiments, a bonding agent may be used to attach the soluble material to the bottom sublaminate 120. In some embodiments, the bonding agent may be a pressure sensitive adhesive, a low temperature adhesive or any other suitable agent. In this embodiment, the bonding agent may or may not be conductive. In a preferred embodiment, the bonding agent is not conductive.

In one embodiment, the top surface of the soluble material is then plated, as shown in process 215. This plating may be a metal plating, having a thickness of 0.7 to 10 mils. In certain embodiments, the metal plating may be copper. Of course, other thicknesses may also be used. This metal plating forms the metal layer 110. In another embodiment, a metal plate is attached to the top surface of the soluble material. This may be a sheet of metal that is aligned and bonded to the soluble material. In this embodiment, the metal plate forms the metal layer 110. In other words, the metal layer 110 may be a plating applied to the soluble material, or may be a sheet placed on the soluble material.

It is noted that the processes 210 and 215 may be prepared in the opposite order. For example, the metal layer 110 may be applied to the soluble material before the soluble material is bonded to the bottom sublaminate 120.

To create a via, a hole is drilled through the metal layer 110, the soluble material and at least part of the bottom sublaminate 120, as shown in process 220. For example, to create via 150, a hole is drilled through the entire stacked assembly. After the hole is drilled, it is then plated, as shown in process 225. This creates a conductive path from the metal layer 110 to the bottom sublaminate 120 in the form of a metal via.

In some embodiments, the via is to be attached to a signal trace or ground layer on an interior layer 123 of the bottom sublaminate 120, such as via 151. In this case, additional process steps may be required. For example, it may be necessary to remove the plating from some layers of the bottom sublaminate 120. For example, assume that the bottom sublaminate has a top surface, a bottom surface and three interior layers, where the via is to be connected to the middle of these three interior layers. After the plating is complete (process 225), a back drilling process may be performed. In this back drilling process, a hole is drilled in the same location as the plated via. However, this hole is drilled to a controlled depth, such that the plating is removed on the bottom surface and the lower interior layer, but is not removed in the other layers of the bottom sublaminate 120. This back drilling process removes the plating from the layers of the bottom sublaminate 120 that are below the layer on which the desired signal trace is disposed, but does not affect the upper layers. Note that this process is not necessary if the signal trace is disposed on the bottom layer.

In another embodiment, to create via 151, the hole may only be drilled to a specific depth within the bottom sublaminate 120, so that the hole touches interior layer 123, but does not pass through the desired interior layer of the bottom sublaminate. The hole is then plated, as described for process 225.

To create a mechanical support 152, a similar process may be used. First, a hole is drilled through the metal layer 110, the soluble material and the bottom sublaminate 120, as shown in process 230. Since this hole is used to provide mechanical support, in some embodiments, its diameter may be greater than that of a standard drill depth to drill diameter aspect ratio via. After the hole has been drilled, the hole is filled with an epoxy or dielectric material, as shown in process 235. This provides mechanical support between the metal layer 110 and the bottom sublaminate.

In other embodiments, where the mechanical support 152 is not drilled all the way through the layers of the bottom sublaminate 120, the mechanical support 152 may be made with a metal or some other conductive material, which is not electrically connected to any signal, ground or power trace in the bottom sublaminate 120.

After the vias and mechanical supports have been created, the metal layer 110 may be patterned, as shown in process 240. This patterning may be performed by an etching process, a laser etching process, or mechanical machining. Since the soluble material will be removed in a later step, the patterning may cut into or mar the soluble material without any detrimental effect.

Figure 3A:
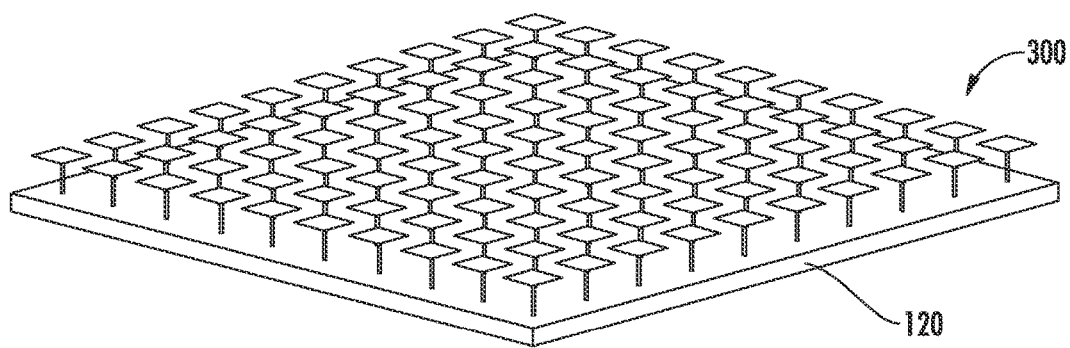
FIGS. 3A-3D show four examples of the type of assemblies that may be constructed using the sequence of FIG. 2.

In certain embodiments, the metal layer 110 is divided into a plurality of smaller metal structures, each of which having a via connecting it to the bottom sublaminate 120. As illustrated in FIG. 3A, each of these metal structures 300 may serve as an antenna material, an electromagnetic bandgap (EBG) material or other electronic structure. In certain embodiments, each of these metal structures is connected to the ground plane in the bottom sublaminate 120.

This EBG structure or antenna is now capable of conformably bending to another base without due stresses applied to outer elements. This makes this usable on tighter radius mounts.

Figure 3B:
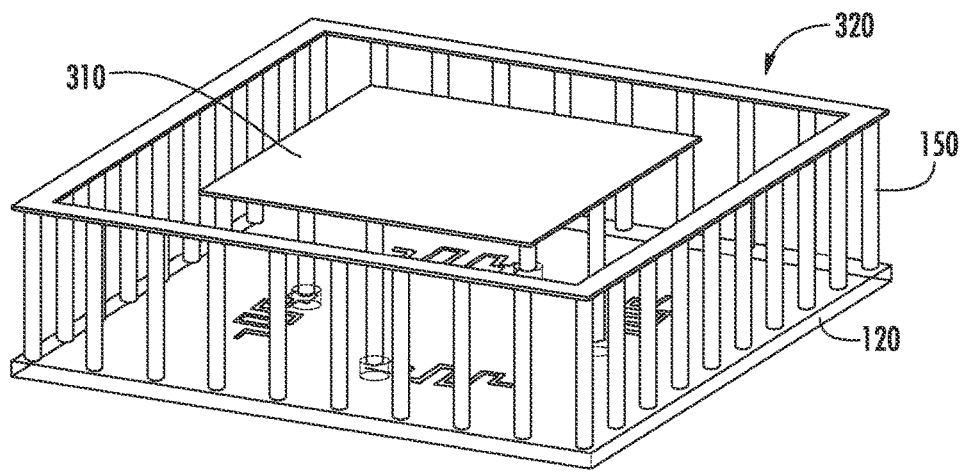

Additionally or alternatively, the metal layer 110 may be etched to form a "fence" and "table" structure, where the copper plating connects several vias. A "fence" structure may be a strip of metal having multiple vias arranged in a linear manner. A "table" structure may be a two dimensional metal structure having multiple vias. An example of both structures is shown in FIG. 3B. In some embodiments, the "fence" and "table" structures may be part of an antenna design. For example, in FIG. 3B, table structure 310 may comprise a patch antenna disposed above the bottom sublaminate 120. The fence structure 320 may also be an electromagnetic boundary, which serves as part of the patch antenna design. Each of these structures is supported by vias 150. Additionally, in each of these configurations, mechanical supports may also be used to better support the metal layer. In certain embodiments, the vias used for the "table" structure connect the metal layer to a RF signal in the bottom sublaminate 120.

Finally, the soluble material may be removed. This may be done by exposing the soluble material to a suitable solvent, such as water. This causes the soluble material to dissolve, as shown in process 245. This process results in the assembly shown in FIG. 1.

Figure 3C:
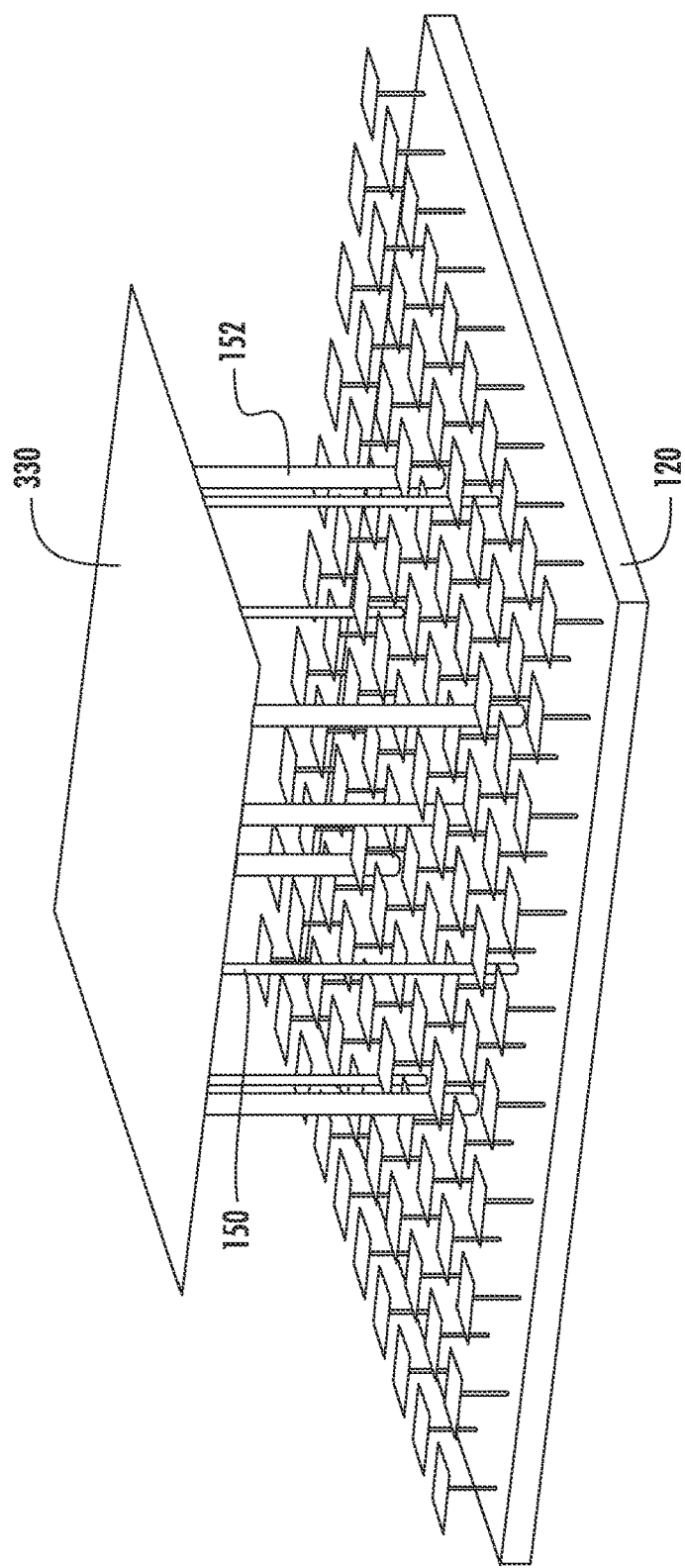

Further, the processes described above may be repeated to create antenna arrangements with multiple heights. For example, after completing process 240, a second soluble material having a second metal layer may be applied to the top of the etched metal layer 110. As described in processes 220-235, additional holes can be drilled through the entire stacked assembly (i.e. the second metal layer, second soluble material, metal layer 110, soluble material and bottom sublaminate 120). These holes can then either be plated to form vias, or filled with epoxy to form mechanical supports. FIG. 3C shows an example of an assembly having a metal layers disposed at two different heights. In this embodiment, the highest level may be a patch antenna 330, which is supported by both vias 150 and mechanical supports 152. The metal layer at the lower level may be discrete structures, such as those illustrated in FIG. 3A. These metal layers may each be connected to a ground, a power or a signal trace. Further the separate metal layers may be connected to different signals.

In summary, in each of the previous embodiments, the metal layer 110 is disposed above the bottom sublaminate 120 and separated by an air gap 130. The metal layer 110 may be supported through the use of vias 150, which also provide electrical connection between the metal layer 110 and the bottom sublaminate 120. As such the vias 150 may be constructed of a conductive material, such as metal. The metal layer may also or alternatively be supported through the use of mechanical supports 152, which do not provide any electrical connection. As such, these mechanical supports 152 may be constructed of a non-conductive material, such as a dielectric material, such as Taiyo UVHP-100. Of course, in other embodiments, a conductive material may be used as a mechanical support. These vias and mechanical supports provide the only connection between the metal layer 110 and the bottom sublaminate 120. There is no intermediate dielectric layer disposed therebetween to support the metal layer 110.

FIG. 4 shows an assembly 400, which is a variation of the assembly 100 shown in FIG. 1. In this embodiment, the top surface 121 of the bottom sublaminate 120 may have one or more components 410 mounted on it. The components may be integrated circuits, passive or active surface mounted devices, or passive components, such as resistors, capacitors or inductors. Further, although only one component 410 is shown in FIG. 4, the disclosure is not limited. A plurality of components 410 may be mounted on the top surface 121 of the bottom sublaminate 120.

The sequence to fabricate the assembly 400 is similar to that shown in FIG. 2. However, in this embodiment, the processing of the bottom sublaminate (process 200) also includes a step where one or more components 410 are surface mounted on the top surface 121 of the bottom sublaminate 120.

Additionally, the preparation of the soluble material (process 205) is also modified. In this embodiment, a recess, corresponding to the location and size of each component 410 is made in the bottom side of the soluble material. These recesses allow the soluble material to be placed on top of the bottom sublaminate 120, without contact the components 410. In other words, the soluble material may be a single block, the thickness of which defines the air gap. In this embodiment, the recess is only made on the bottom of the block of soluble material, while the top surface of the soluble material remains unaffected and planar.

The remaining processes of FIG. 2 are then carried out, which results in the assembly 400 shown in FIG. 4.

While the previous disclosure described a soluble material having a recess in the bottom surface to accommodate the component 410, other embodiments are also possible. For example, cut performs may be made from the soluble material. These cut performs may be used to build up the soluble material from the top surface of the bottom sublaminate 120 at least to the height of the tallest component 410. After this, a top layer of soluble material may be applied over all of the cut performs. In some embodiments, the metal layer 110 may be plated on this top layer of soluble material. In other embodiments, the metal layer 110 may be disposed on this top layer of soluble material. After this is completed, the remaining processes of FIG. 2 may be performed.

Figure 3D:
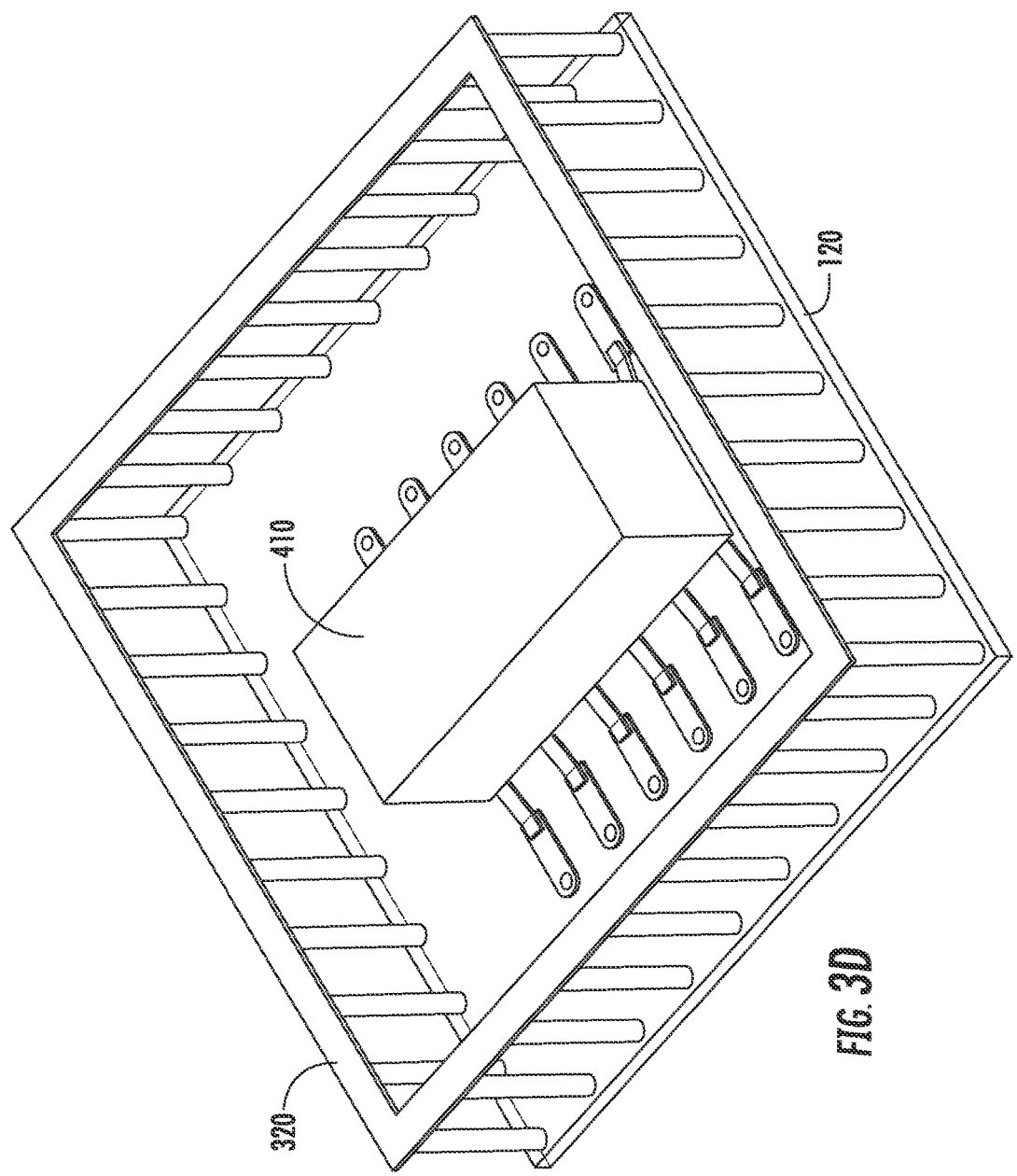

Such a method may result in the configuration shown in FIG. 3D, where a component 410 is mounted on the top surface of the bottom sublaminate 120, while a metal layer 110 is disposed above the bottom sublaminate 120. For example, FIG. 3D shows a fence structure 320, similar to that illustrated in FIG. 3B. Of course, other types of electronic structures may also be used with the component 410.

FIG. 5 is a variation of FIG. 1. In this embodiment, the assembly 500 comprises a bottom sublaminate 120, an air gap 130, and a top sublaminate 510. This assembly 500 differs from the assembly 100 of FIG. 1 in that the metal layer 110 is disposed on a layer of dielectric material 520, forming top sublaminate 510. The dielectric material 520 may be a traditional dielectric material used for PCB fabrication, such as FR4 or another printed circuit board laminate material.

To create this assembly 500, the bottom sublaminate 120 is processed, as described in process 200 (see FIG. 2). The top sublaminate 510 is also processed. This may include plating the layer of dielectric material 520 to create the metal layer 110. Of course, the metal layer 110 may be disposed on the layer of dielectric material 520 in other ways. For example, the metal layer 110 may be a separate sheet and may be disposed on the layer of dielectric material 520 and aligned using alignment holes.

The soluble material is then disposed on the bottom sublaminate 120 (process 210).

This top sublaminate 510 is then disposed on the top surface of the soluble material, such that the dielectric material 520 is disposed between the soluble material and the metal layer 110. In certain embodiments, the top sublaminate 510 may be bonded to the top surface of the soluble material. In other embodiments, the top sublaminate 510 is simply placed on the top surface of the soluble material.

Holes are then drilled through the top sublaminate 510, the soluble material and the bottom sublaminate 120 (process 220). These holes are plated to form vias (process 225). Additionally, other holes may be drilled through the top sublaminate 510, the soluble material and the bottom sublaminate 120 (process 230). These holes may be filled with a non-conductive material to form mechanical supports (process 235).

In one embodiment, the metal layer 110 is then patterned (process 240). In certain embodiments, such as that shown in FIG. 5, the layer of dielectric material 520 remains intact while the metal layer 110 is patterned.

In embodiments where the dielectric material 520 remains intact, it is possible to pattern the metal layer 110 at any point in this sequence. For example, the metal layer 110 may be patterned as part of the preparation of the top sublaminate 510 before it is disposed on the soluble material.

After the metal layer 110 has been patterned, the soluble material is dissolved (process 245).

Of course, the top sublaminate 510 may be combined with other embodiments. For example, the embodiments shown in FIGS. 3A-3D may all be created using either a metal layer 110 or a top sublaminate 510.

While particular embodiments of the disclosure have been shown and described, it will be obvious to those skilled in the art that various changes and modifications may be made without departing from the present disclosure in its broader aspects. It is intended that all matter contained in the above description and shown in the accompanying drawings shall be interpreted as illustrative and not in a limiting sense.

What is claimed is:

1. A method of manufacturing an assembly, comprising:
   processing a bottom sublaminate;
   disposing a soluble material on a top surface of the bottom sublaminate, wherein the soluble material is a block or a sheet and is machined, planarized or otherwise formed to a desired thickness;
   disposing a metal layer on a top surface of the soluble material;
   drilling a hole through the metal layer, the soluble material and the bottom sublaminate;
   plating the hole with a conductive material to create a via electrically connecting the metal layer to a signal in the bottom sublaminate, wherein the signal in the bottom sublaminate is a signal trace or a ground; and
   dissolving the soluble material after the via is created, so that the bottom sublaminate is separated from the metal layer by an air gap, wherein the metal layer functions as an antenna.

2. The method of claim 1, further comprising:
   drilling a second hole through the metal layer, the soluble material and the bottom sublaminate; and
   filling the second hole with a non-conductive material to form a mechanical support between the metal layer and the bottom sublaminate.

3. The method of claim 1, further comprising:
   mounting a component on the top surface of the bottom sublaminate prior to disposing the soluble material on the bottom sublaminate.

4. The method of claim 3, further comprising
   forming a recess in the soluble material that corresponds to a location and size of the mounted component prior to disposing the soluble material on the bottom sublaminate.

5. The method of claim 3, further comprising:
   creating a plurality of cut preforms using the soluble material;
   disposing the cut preforms on the top surface of the bottom sublaminate to a height of the component; and
   wherein the soluble material is disposed on top of the cut performs.

6. The method of claim 1, further comprising patterning the metal layer.

7. The method of claim 6, wherein the patterning is performed by etching, laser etching or machining of the metal layer.

8. The method of claim 6, wherein the patterning forms a fence structure, comprising a strip of the metal layer supporting by a plurality of vias arranged in a linear manner, wherein the plurality of vias are formed by drilling holes through the soluble material and filling the holes with metal.

9. The method of claim 6, wherein the patterning forms a table structure, comprising a two dimensional structure of the metal layer supported by one or more vias, wherein the one or more vias are formed by drilling holes through the soluble material and filling the holes with metal.

10. The method of claim 1, further comprising creating a plurality of vias by drilling holes through the soluble material and filling the holes with metal, and patterning the metal layer to form a plurality of discrete metal structures, each supported by at least one via.

11. The method of claim 1, wherein the top surface of the soluble material is plated to form the metal layer.

12. A method of manufacturing an assembly, comprising:
    processing a bottom sublaminate;
    disposing a soluble material on a top surface of the bottom sublaminate;
    disposing a metal layer on a top surface of the soluble material;
    drilling a hole through the metal layer, the soluble material and the bottom sublaminate;
    plating the hole with a conductive material to create a via electrically connecting the metal layer to a signal in the bottom sublaminate, wherein the signal in the bottom sublaminate is a signal trace or a ground;
    dissolving the soluble material after the via is created, so that the bottom sublaminate is separated from the metal layer by an air gap; and
    creating a second metal layer disposed above the metal layer, having a second via connecting the second metal layer to a second signal in the bottom sublaminate.

13. The method of claim 12, wherein the second metal layer is created after the via is created and before the dissolving of the soluble material.

14. The method of claim 13, wherein the creating the second metal layer comprises:
    disposing a second soluble material on a top surface of the metal layer;
    disposing a second metal layer on a top surface of the second soluble material;
    drilling a second hole through the second metal layer, the second soluble material, the soluble material and the bottom sublaminate;

plating the second hole with a conductive material to create a second via electrically connecting the second metal layer to a second signal in the bottom sublaminate.

15. The method of claim 14, further comprising:
drilling a third hole through the second metal layer, the second soluble material, the soluble material and the bottom sublaminate;
filling the third hole with a non-conductive material to form a mechanical support between the second metal layer and the bottom sublaminate.

16. The method of claim 1, wherein the metal layer is disposed on a layer of dielectric material, and the layer of dielectric material is disposed between the metal layer and the top surface of the soluble material.

* * * * *